United States Patent [19]

Moslehi

[11] Patent Number: 5,405,492
[45] Date of Patent: Apr. 11, 1995

[54] METHOD AND APPARATUS FOR TIME-DIVISION PLASMA CHOPPING IN A MULTI-CHANNEL PLASMA PROCESSING EQUIPMENT

[75] Inventor: Mehrdad M. Moslehi, Dallas, Tex.

[73] Assignee: Texas Instruments Incorporated, Dallas, Tex.

[21] Appl. No.: 159,271

[22] Filed: Nov. 30, 1993

Related U.S. Application Data

[62] Division of Ser. No. 580,986, Sep. 12, 1990, Pat. No. 5,273,609.

[51] Int. Cl.$^6$ ............................................. H01L 21/00
[52] U.S. Cl. ..................... 156/643; 156/345; 427/492; 427/493; 427/508; 427/551
[58] Field of Search ............... 156/643, 345; 118/722, 118/723; 315/111.21; 313/231.31; 204/298.31, 298.33; 427/457, 492, 493, 508, 558, 551

[56] References Cited

U.S. PATENT DOCUMENTS

| | | | |
|---|---|---|---|
| 4,668,337 | 5/1987 | Sekine et al. | 156/345 |
| 4,919,077 | 4/1990 | Oda et al. | 118/723 |
| 4,935,661 | 6/1990 | Heinecke et al. | 315/111.21 |
| 4,943,345 | 7/1990 | Asmussen et al. | 156/345 |
| 4,971,832 | 11/1990 | Arai et al. | 118/723 |
| 4,985,114 | 1/1991 | Okudaira et al. | 156/643 |
| 4,988,533 | 1/1991 | Freeman et al. | 427/294 |
| 4,989,544 | 2/1991 | Yoshikawa | 118/723 |
| 4,993,361 | 2/1991 | Unvala | 118/723 FI |
| 5,262,610 | 11/1993 | Huang et al. | 219/121.43 |
| 5,273,609 | 12/1993 | Moslehi | 156/345 |

FOREIGN PATENT DOCUMENTS

63-239948  10/1988  Japan.
1-226152   9/1989  Japan.
2-172223   7/1990  Japan.

OTHER PUBLICATIONS

K. Tsujimoto et al., "A New Side Wall Protection Technique in Microwave Plasma Etching Using a Chopping Method", Extended Abstracts of the 18th (1986 International) Conference on Solid State Devices and Materials, Tokyo, 1986, pp. 229–232.

Primary Examiner—R. Bruce Breneman
Assistant Examiner—George Goudreau
Attorney, Agent, or Firm—Ira S. Matsil; James C. Kesterson; Richard L. Donaldson

[57] ABSTRACT

A multi-switch processing methodology and a multi-channel time-division plasma chopping device (10) for in-situ plasma-assisted semiconductor wafer processing associated with a plasma and/or photochemical processing equipment. The device (10) comprises a main transfer channel (72) associated with the processing reactor for transferring process gas and activated plasma mixtures into the reactor. A plurality of gas discharge channels (18, 22, 26, and 30) associate with the main transfer channel (72) for independently directing various gases and activated plasma combinations to main transfer channel (72). Process excitation sources (16, 20, 24 and 28) associate with at least one of said gas discharge or activation channels to independently and selectively activate process gases and to control gas activation and flow from the discharge channels to the main transfer channel (72). The method of the present invention performs multi-channel time-division plasma chopping by independently and selectively generating plasma or activated species using a plurality of remote plasma generation process energy sources (16, 20, 24, and 28) associated with the semiconductor wafer fabrication reactor.

12 Claims, 4 Drawing Sheets

METHOD AND APPARATUS FOR TIME-DIVISION PLASMA CHOPPING IN A MULTI-CHANNEL PLASMA PROCESSING EQUIPMENT

This is a division of application Ser. No. 07/580,986, filed Sep. 12, 1990; now U.S. Pat. No. 5,273,609.

TECHNICAL FIELD OF THE INVENTION

The present invention relates in general to semiconductor device fabrication, and more particularly to a method and apparatus for time-division plasma chopping and multi-switch semiconductor wafer processing in a multi-channel plasma processing reactor.

BACKGROUND OF THE INVENTION

Manufacturers of microelectronic devices use a variety of wafer processing techniques to fabricate semiconductor integrated circuits. One technique that has many important applications is known as plasma processing. In plasma processing, a substantially ionized gas, usually produced by a radio-frequency (RF) or microwave electromagnetic gas discharge, provides activated neutral and ionic species that chemically react to deposit or to etch material layers on semiconductor wafers in plasma processing equipment.

Applications of plasma-assisted processing techniques for semiconductor device manufacturing include reactive-ion etching (RIE) of polysilicon, aluminum, oxide and polyimides; plasma-enhanced chemical-vapor deposition (PECVD) of dielectrics, metals, and other materials; low-temperature dielectric chemical-vapor deposition for planarized inter-level dielectric formation; and low-temperature growth of epitaxial semiconductor layers. Additional applications of plasma processing include plasma surface cleaning and physical-vapor deposition (PVD) of various material layers.

In plasma-assisted deposition and etching, a process "activation switch" acts on the electromagnetic process energy source and begins the plasma-assisted fabrication process. Although not necessarily a tangible "ON/OFF" switch, an activation switch performs the process on/off function by starting a fabrication process by its activation of a process energy source (e.g., RF power source) and stopping the process by its removal of the energy source. An activation switch for a plasma-assisted process may, for example, be the presence of a radio-frequency electromagnetic gas discharge source or some other process energy source without which the process cannot occur.

Semiconductor device fabrication processes including etch and deposition techniques use a process activation switch in order to drive the desired process. In plasma processing, the particular type of plasma-assisted process to be performed affects the process activation switch choice. The choice of activation switch for any device fabrication process, regardless of whether the process is a deposition or etch process, also may significantly affect the final semiconductor device properties.

For example, J. Gibbons et al., "Limited Reaction Processing: Silicon Epitaxy," *Applied Physic Letters*, 47(7), 1 Oct. 1985, pp. 721-23, describes a material layer deposition process known as limited-reaction processing or "LRP" that uses a thermal process activation switch (wafer temperature). On the other hand, K. Tanjimoto, et a l., "A New Side Wall Protection Technique in Microwave Plasma Etching Using a Chopping Method," *Extended Abstracts of the* 18th (1986 *International*) *Conference on Solid State Devices and Materials*, Tokyo, 1986, pp. 229-32, describes a process known as "time-division gas chopping" that uses a reactive process gas flow as the process activation switch. Although these processes represent the most advanced known uses of single activation switches for material layer deposition and etch processes, respectively, each of these techniques have significant limitations.

LRP provides a capability for multilayer processing by using wafer temperature cycling as the only available process activation switch. Process environment for deposition of a subsequent layer is stabilized while the thermal switch is off. In LRP, a semiconductor wafer is placed within a single-wafer reaction process chamber filled with a desired process gas (e.g. for epitaxial silicon growth or polysilicon deposition). By only using a single thermal process activation switch, usually a heating lamp, LRP can deposit multiple material layers on a semiconductor wafer. To begin the process, first the process ambient is established by starting the desired process gas flows while the thermal activation switch is off (cold wafer). Then, the semiconductor wafer is heated to the desired process temperature by activating the process energy source (heating lamp). Once the wafer reaches the process temperature, a layer of material (e.g., epitaxial silicon) is deposited on the wafer to a desired thickness. Once the layer reaches the desired thickness, the heat source, which is the main process energy source, is turned off. The next step is to evacuate the process gases from the reactor process chamber and to establish the process environment for the next in-situ deposition step while the process activation switch (heating source) remains off. The semiconductor wafer is then restored to a high temperature by activating the heating source in preparation for a next elevated-temperature material layer growth or deposition step. An example of an LRP sequence may be as follows: a first layer may be an epitaxial silicon layer, a second layer may be an SiO$_2$ layer, a third layer may be a polysilicon layer, followed by another oxidation step.

Because LRP uses only one process activation switch, it provides limited flexibility in depositing multiple layers by in-situ multiprocessing. Additionally, temperature activation switching used in LRP and other multiprocessing techniques can cause thermally-induced defects and stresses, both within the semiconductor substance and between the deposited or grown layers. The thermally-induced stresses and defects such as slip dislocations can arise from rapid cooling and heating that occurs between fabrication process steps. Since thermal energy is the only available process activation energy source, the process temperatures in LRP are rather high (e.g., 650°-1200° C. ) which can further increase the thermally-induced defect generation problem.

Consequently, there is need for semiconductor wafer multiprocessing techniques that permit in-situ deposition and/or etching of multiple layers on a semiconductor substrate with more than one process activation switch and multiple process energy sources.

There is also a need for a semiconductor wafer fabrication process that eliminates excessive thermal stresses and substrate defects caused by repetitive semiconductor wafer heating and cooling cycles between multiple layer depositions.

Time-division gas chopping eliminates some problems or limitations associated with conventional etching techniques. For example, some conventional plasma-assisted anisotropic etching techniques use a mixture of at least two process gases within a process chamber to generate a mixed gas plasma. The mixed process medium usually consists of a sidewall passivation gas and an etch gas. Using a composite process medium, however, gas discharge characteristics can become complex and many different activated species are produced within the process chamber. Sometimes the discharge characteristics are predictable; other times there are interactive gas-phase reaction effects between different activated species that are neither easily predictable nor desireable. For example, using a combination of two or more gases in the process chamber, gas discharge can produce a composite plasma medium that yields unwanted gas-phase reactions and nucleations. Gas-phase nucleations are caused by reactions between different activated plasma species, resulting in generation of particles and reduction of the semiconductor device fabrication yield. Thus, it is preferred to avoid those possible gas-phase reactions by reducing the number of different gases present within the activated plasma environments at the same time.

Anisotropic etching processes are expected to produce well-defined and near-vertical patterned layer sidewalls on semiconductor wafers following the removal of the etched portions. These near-vertical or vertical pattern sidewalls with minimal undercut are essential to the design and performance of the resulting integrated circuit. Particles from gas-phase nucleations within a composite plasma environment can produce defects on semiconductor devices. However, the use of multiple process gases and composite plasmas are essential in some anisotropic etch processes in order to prevent lateral etching or etch undercut and to increase the degree of plasma etch anisotropy. This is due to the fact that at least one gas in the mixed plasma environment forms a passivation layer on pattern sidewalls and prevents lateral etch or undercut.

Time-division gas chopping attempts to solve these problems of conventional plasma-assisted anisotropic etch processes by periodically switching between two different process gases. The first gas is usually a reactive etch gas (e.g. a halogen-containing compound) which can remove any exposed material layers; the second gas is a sidewall passivation gas which is supposed to prevent pattern lateral sidewall etch. The etch gas serves to etch the exposed material layer on a semiconductor wafer according to a pre-specified pattern design transferred to a photoresist or a hard-mask layer by microlithography. The sidewall passivation gas deposits a thin etch passivation layer on the substrate surface including etched pattern sidewalls. The thin sidewall passivation layer prevents lateral etching or undercutting of the sidewalls that could occur by the etch gas during a subsequent material etch step. This protects the pattern sidewalls during an anisotropic etching process following the surface passivation step. The passivation layer is sufficiently thin that during a subsequent anisotropic etching step, the directional and energetic ions in plasma can remove it from flat horizontal surfaces and form the desired circuit pattern by anisotropic etching. Sequentially depositing a passivation layer and performing an anisotropic etch step significantly reduces lateral sidewall etching. This results in an overall fabrication process yield improvement.

Time-division gas chopping also minimizes composite discharge effects and gas-phase nucleations and particle generation by using only one plasma process gas at a time. Using only one gas at a time also yields more predictable and reproducible etch results from one semiconductor wafer to another (wafer-to-wafer process repeatability).

Although time-division gas chopping results in some improvements over conventional mixed-gas composite plasma-assisted anisotropic etching techniques, significant limitations also exist in that process. By cyclicly or sequentially introducing the etch gas followed by the passivation gas, a throughput or etch rate degradation occurs, because of the rather slow gas flow transient times and the need to pump out the process chamber after each etch or passivation cycle and to reestablish the process environment for the subsequent passivation or etch process step at the end of each preceding process step. This requires a completely new volume of process gas to perform each etching or passivation step in a multi-step anisotropic etch process.

Another problem of time-division gas flow chopping also relates to the repeated etch process gas/passivation gas cycling. By starting and stopping gas flows through gas lines connected to the fabrication reactor, particulates from the gas lines and valves may enter the process chamber and contaminate the semiconductor wafer. Each sudden surge of gas flow, whether opening or closing the gas valves or mass-flow controllers, can introduce particulates into the process chamber. This particulate contamination degrades the semiconductor device manufacturing yield.

Yet another limitation associated with the time-division gas chopping technique relates to long gas flow transient times required for stabilizing the process chamber for sequential etch and passivation plasma environments between adjacent cycles. With each cycle, time delays on the order of several seconds to tens of seconds may be necessary to pump out the preceding process gas ambient and to stabilize the new process environment. For a given anisotropic etch process, it may be necessary to use a number of etch-passivation cycles in order to complete the etch process. As a result, the gas on/off cycles and process stabilization periods may contribute significantly to the total etch process time for each semiconductor wafer.

Thus, there is a need for a plasma-assisted semiconductor device fabrication technique that eliminates the need for composite mixed-gas discharge and minimizes any gas-phase nucleations and particulate contamination without reducing the overall wafer processing throughout.

There is a need for plasma-assisted semiconductor device fabrication etch and deposition techniques that allow the use of various process gases without the transient flow surges and particulate contamination from the gas flow lines and valves that may contaminate the semiconductor wafer.

There is yet a need for a plasma-assisted device fabrication technique that permits the use of alternating etch gas/passivation plasma processing cycles without having to deal with the long transient times associated with the time-division gas flow cycling method.

SUMMARY OF THE INVENTION

According to one aspect of the present invention, there is provided a method and apparatus for time-division plasma chopping in a multi-channel plasma processing reactor for various material layer etch and deposition applications. The invention comprises the necessary gas flow channels and methodology for the controlled simultaneous use of multiple process activation switches including thermal energy and radio-frequency (RF) gas discharge energy sources disposed within the process chamber as well as process plasma energy sources placed external to the process chamber, to overcome the limitations associated with known deposition and etching methods for semiconductor device fabrication.

According to one aspect of the invention, there is provided a time-division multi-channel plasma chopping apparatus that includes a main plasma transfer channel to transfer various process gases and activated plasma flows into a fabrication reactor wafer processing chamber. A plurality of gas discharge channels feed various process gas and plasma combinations to the main transfer channel. Each gas discharge or activation channel has at least one energy/excitation source with its associated process activation switch that independently controls plasma generation within the gas discharge channel. The process energy source in each gas discharge or activation channel may be a radio-frequency power source, a microwave source, a deep ultraviolet source, or other gas excitation sources.

By selectively controlling the process energy/excitation sources or their associated process activation switches, the present invention allows an operator to produce various process plasmas or activated species according to the requirements of a particular fabrication process step. The combined effects of process plasma resulting from selective activation of one or more of these energy/excitation sources (plasma or photochemical) and a thermal energy source and/or a radio-frequency chuck associated with the wafer, within the fabrication reactor are to start and stop different process steps in a multi-step semiconductor device fabrication process. This methodology results in reduced process gas cycling and enhanced processing throughout for a given fabrication process.

Another aspect of the present invention includes a method for multi-channel time-division plasma chopping in association with plasma-assisted and/or photochemical processing in a semiconductor wafer processing equipment. The method comprises the steps of independently and selectively generating a plurality of process plasmas or activated species using a plurality of independent process gas excitation sources configured in parallel. Various process gases are independently directed through a plurality of discharge or gas activation channels associated with respective gas excitation sources towards a main process gas/plasma transfer channel. The mixture of molecular gases and activated wafer plasma are directed through the main fluid transfer channel to the process chamber of the fabrication reactor where the semiconductor substrate is placed. Depending on the desired step of a multi-step chopped plasma process, the method includes independently and selectively controlling the "off" and "on" states of the process activation switches or energy/excitation sources according to a specific semiconductor device fabrication recipe.

Continuously flowing process gases through the individual gas activation discharge channels and through the main transfer channel to the process chamber during a semiconductor device fabrication process is an important aspect of the present invention. Various process energy/excitation sources or process activation switches for the multi-channel wafer processing equipment may include deep ultraviolet photochemical, remote microwave plasma, and other plasma generating or gas activation sources.

A technical advantage of the present invention is that it overcomes thermal stress limitations associated with conventional multiprocessing techniques such as limited reaction processing. Not only does the present invention permit the simultaneous use of multiple process energy sources beyond only a thermal activation energy source, but also thermally induced stresses and defects are eliminated in the present invention due to reduced dependency of in-situ multiprocessing recipes on cycling of thermal energy (wafer temperature) for process activation and control. This is true, because using energy sources other than only a thermal activation source allows the use of much lower process temperatures. Lower wafer temperatures in conjunction with the availability of additional process activation sources (e.g., plasma, photochemical) result in reduced amount of wafer temperature cycling and thermally induced stresses in a given multi-step process.

Yet another technical advantage of the present invention is that it provides all the advantages of time-division gas chopping in anisotropic plasma etch processes without the limitations associated with that technique. For example, using the time-division plasma chopping technique of the present invention, multiple and frequent process gas switching is not necessary. Multichannel plasma chopping allows continuous flow of several process gases with selective time-division chopping of plasma excitation sources in various plasma gas excitation channels. This eliminates particulate contamination of a process chamber and semiconductor substrate due to process gas switching and improves the overall process throughout.

Still another technical advantage of the present invention is that unlike the gas flow chopping method, there is no need to use repeated sequential starting and stopping (or switching) of process gases, i.e., etch gas followed by passivation gas, through the process reactor. This flexibility eliminates the long gas flow transient times and also the long process ambient stabilization times associated with time-division gas chopping. As a result, the time-division multi-channel plasma chopping technique of the present invention significantly improves process throughput relative to conventional time-division gas chopping.

A further technical advantage of the time division plasma chopping device and method of the present invention is that it permits the use of numerous process activation switches and energy sources in parallel to perform sequential multi-step semiconductor device processing.

BRIEF DESCRIPTION OF THE DRAWINGS

The invention, as well as modes of use and further advantages, is best understood by reference to the following description of illustrative embodiments when read in conjunction with the accompanying drawings.

DETAILED DESCRIPTION OF THE INVENTION

The preferred embodiment of the present invention is best understood by referring to the FIGUREs, like numerals being used for like and corresponding parts of the various drawings.

Figure 1:
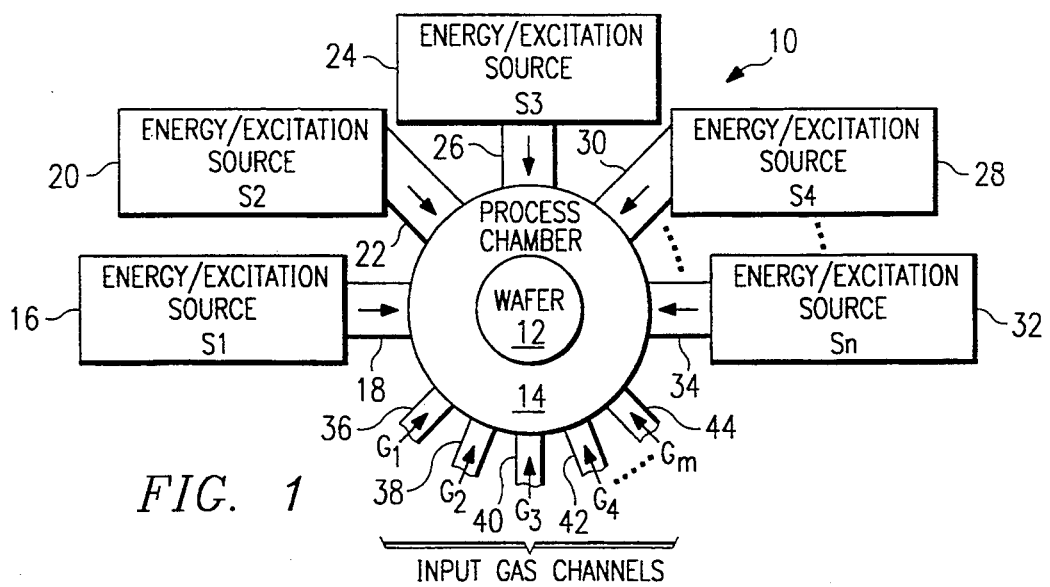
FIG. 1 shows a schematic block diagram to illustrate fundamental concepts of multi-switch processing and the multi-channel time-division energy source chopping apparatus of the present invention.

FIG. 1 is a schematic, block-diagram illustrating multi-switch processing concepts fundamental to the multi-channel time-division plasma chopping apparatus and method 10 of the present invention. According to FIG. 1, the multi-switch time-division processing apparatus 10 of the present invention comprises multiple (two or more) independently-operated process energy/excitation sources 16, 20, 24, 28 and 32 and process gas sources 36, 38, 40, 42 and 44 which associate with semiconductor wafer 12 within process chamber 14. Process energy/excitation source-S1 16 associates via energy source coupler 18 with process chamber 14. Similarly, energy/excitation sources S2 through -Sn 20, 24, 28 and 32 associate with process chamber 14 via energy source couplers 22, 26, 30 and 34. Input gas channels $G_1$ through Gm 36, 38, 40, 42 and 44, respectively, provide process gases into process chamber 14. Each process-/activation source may either act directly on the wafer and entire process environment (mixture of gases) within the process chamber or may selectively and remotely activate a pre-specified gas channel.

The multi-switch processing equipment configuration of FIG. 1 has use for thin film deposition, material layer etching, or semiconductor wafer cleaning and annealing. One respect in which the conceptual configuration of FIG. 1 differs from a conventional processing equipment configuration is that the only activation switch for conventional processes is usually a single process energy source such as RF plasma or wafer thermal energy. By using multiple independently-controlled process energy sources and their associated activation switches to provide multi-switch processing and/or time-division plasma chopping, the present invention avoids problems associated with both excessive temperature cycling and gas flow cycling of known processing techniques. For example, in conventional processes such as limited reaction processing ("LRP"), large-range wafer temperature cycling occurs for each stage of a multi-step process.

Using multiple process activation switches and energy sources, the present invention can achieve the same or better results than LRP with reduced degree of thermal cycling and without the associated semiconductor wafer thermal stresses and slip dislocations. Another advantage of the present invention is that it permits the simultaneous use of two or more independent process energy sources by proper control of process activation switches in the time domain. Process activation switches for the present invention could associate with various process energy sources such as wafer temperature elevation by a heating lamp or resistive heat source, radio-frequency plasma generation within the process chamber, and remote microwave plasma generation by one or more of the remote excitation sources (S1 through Sn represent the process activation switches for "n" process energy sources). Additionally, S1 through Sn may control any combination of photochemical sources, deep ultraviolet coherent and incoherent sources, or other process energy sources capable of operating as process and gas activation elements. The process activation switches may be operated as digital or binary ON/OFF switches. The "ON" state of a given switch will activate its associated process energy source at a predetermined energy level. The "OFF" state of any process activation switch removes (or inactivates) the process energy source associated with the off-state switch. On the other hand, any of the process activation switches may operate its associated process energy source over more than two discrete levels. These multiple switch levels could correspond to one "OFF" state and several "ON" states to deliver different energy fractions of a process energy source to the process environment. In general, any process activation switch may be a binary ON/OFF switch or a multi-level digitized switch with one "OFF" and multiple "ON" states. Analog switches may also be used which will allow operation of energy source over a continuum. The multi-switch processing and time-division plasma chopping methods and apparatus of this invention can employ various types of process activation switches. The "ON" state level of any process energy source is usually optimized for a given process and its choice may also be affected by the presence of other process energy sources activated during a given processing step.

Figure 2:
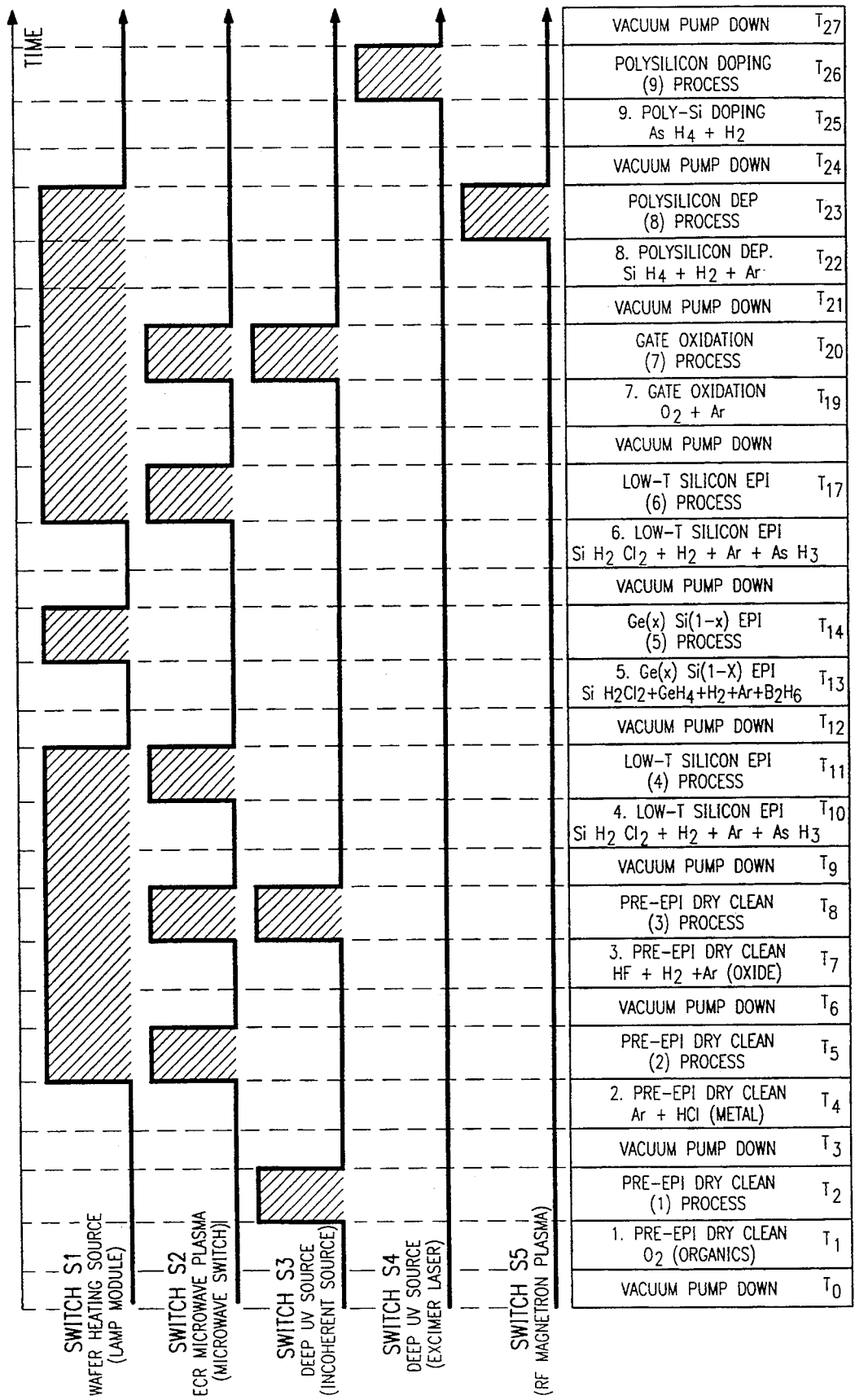
FIG. 2 is a time-sequence chart or process switch pulse diagram of a multi-cycle semiconductor fabrication process sequence employing the multi-switch processing apparatus and method of the present invention for in-situ epitaxial layer multiprocessing.

FIG. 2 illustrates the use of five independent process energy sources and their associated activation switches that may take the configuration that FIG. 1 depicts. Along the left-hand vertical side of FIG. 2 appears a listing of various process activation switches that may be used in a multi-step plasma-assisted device fabrication process. Switch "S1" is a wafer heating or thermal energy source such as a heating lamp module; Switch "S2", an ECR or electron cyclotron resonance microwave plasma source; S3, a deep ultraviolet incoherent photochemical source; S4, a deep ultraviolet excimer laser photochemical source; and S5, an RF magnetron plasma source. Each Switch S1 through S5 has a time line to represent the pulse diagram time sequence from the beginning of the multi-step fabrication process. The time lines move from the left vertical side (process start) of FIG. 2 to the right vertical side (process end). Elevated portions or high states of each signal indicate times when the respective process activation switch operates in an energized or excited state.

The bottom of FIG. 2 shows, from left to right, a sequence of several process steps for performing a multi-step in-situ semiconductor device fabrication process. The steps in this representative example may be grouped into nine sub-processes as follows:

1. Pre-epitaxial dry cleaning to remove organic contaminants;
2. Pre-epitaxial dry cleaning to remove metallic contaminants;
3. Pre-epitaxial dry cleaning to remove native oxide;
4. Low-temperature silicon epitaxial growth;
5. Germanium/silicon epitaxial growth;
6. Low-temperature silicon epitaxial growth;
7. Gate oxidation;
8. Polysilicon layer deposition; and
9. Polysilicon layer doping.

Five independent process energy sources (and process activation switches) are used in this example. The precise number of necessary process energy sources and their types can vary depending on the multi-channel processing equipment design and the in-situ multi-processing requirements. The process energy sources shown in this example can be sequentially controlled in the time domain such that the entire nine sub-process steps are performed with reduced thermal cycling or switching of the thermal energy source. All these process activation sources can be implemented in a properly designed multi-processing equipment consisting of ECR plasma source, wafer heating source, RF magnetron plasma, and photochemical energy sources.

Each of the process activation switches S1 through S5 can be operated independently to perform its respective process energy source control for the multi-step fabrication process. The multi-step in-situ fabrication process example of FIG. 2 takes place according to the following sequence. First, the process chamber 14 is vacuum-pumped at step T0. This establishes the necessary initial clean environment to perform the fabrication process sequence. Next, the pre-epitaxial dry cleaning of organics occurs. This sub-process established the necessary process environment during step T1 when all the process activation switches are off. This sub-process uses Switch S3 to activate the deep ultraviolet incoherent photochemical source to activate the organic cleaning process during step T2. The high or raised portion of Switch S3's time line corresponding to step T2 indicates energizing process activation Switch S3. Following the pre-epitaxial dry cleaning process of step T2, the processing chamber is again pumped down to vacuum at step T3.

Pre-epitaxial dry removal of metals, the next sub-process, uses as the process gas a mixture of Ar and HCl gases. The process environment for this sub-process is stabilized during time step T4 when all process activation switches are off again. This process activates Switch S2-ECR microwave plasma process energy source and Switch S1-wafer heating lamp module for low-temperature ECR plasma-assisted process activation. During the pre-epitaxial dry cleaning process T5, Switch S2 and Switch S1 remain energized. Following the pre-epitaxial dry metallic cleaning process T5, however, Switch S2 for ECR plasma is inactivated and Switch S1 for thermal energy remains energized. Switch S1 will remain energized through a portion of the remaining steps in the multi-step fabrication process of FIG. 2 in order to minimize wafer thermal cycling and enhance overall processing throughout. The activated level of thermal Switch S1 is sufficiently low such that it cannot drive a subsequent epitaxial silicon growth process by itself unless an additional process energy source is activated. The subsequent sub-process establishes the necessary oxide removal process environment (HF+H$_2$+Ar ambient) during time step T7 following a vacuum pump down step T6. The native oxide removal process step employs three simultaneous process energy sources by activating additional process Switches S2 (ECR plasma) and S3 (deep ultraviolet light photochemical) while the thermal energy source Switch S1 remains activated. This is done during the time step T8. Following the native oxide removal step T8, process activation Switches S2 and S3 are turned off and a vacuum pump down step T9 occurs (while the thermal energy Switch S1 remains on in order to minimize wafer thermal cycling). Immediately following the pre-epitaxial dry cleaning process T8, vacuum pump down T9 of process chamber 14 occurs.

Sub-process 4, a low-temperature in-situ-doped epitaxial silicon growth on the semiconductor wafer takes place next. This sub-process uses a mixture of gases, including SiH$_2$Cl$_2$, H$_2$, Ar, and AsH$_3$. The epitaxial growth process environment is stabilized during time step T10 when only thermal Switch S1 is on. However, the thermal switch by itself cannot cause epitaxial silicon growth. Process activation sources including Switch S1-wafer heating source and Switch S2-ECR microwave switch provide necessary process excitation energy sources for the low-temperature epitaxial silicon growth process T11. Following the completion of epitaxial growth step S11, process chamber 14 vacuum pump down T12 occurs. At this time, Switch S1 and Switch S2 de-energize. This is the first time Switch S1 or wafer thermal energy has been de-energized since being initially energized for pre-epitaxial dry cleaning step T5. This shows how using more than one process activation switch eliminates the need for repeated thermal cycling that may occur when using only the wafer heating source as process activation switch. Moreover, temperatures that the wafer heating source produces at the semiconductor wafer in a multi-switch processing equipment can be lower than those required when the wafer heating source is the only process activation switch. As a result, the extreme high temperatures occurring in that case are eliminated with the use of multiple activation switches and process energy sources.

In-situ-doped germanium-silicon epitaxial growth is the next set of steps in the multi-step fabrication process example of FIG. 2. The gas combination for this sub-process is a mixture of SiH$_2$Cl$_2$, GeH$_4$, H$_2$, Ar and B$_2$H$_6$. The process ambient for this sub-process is stabilized during time step T13 during which all the process activation switches, including the thermal Switch S1, are off. The thermal Switch S1 is off because it may activate the Ge$_x$Si$_{(1-x)}$ growth process even by itself. This process includes germanium-silicon epitaxial growth step T14 which uses only Switch S1-wafer heating source as the activation switch. Next, process chamber 14 is pumped down T15 to establish process chamber conditions for the next set of fabrication steps. The process activation Switch S1 is turned off during T15 in order to prevent any uncontrolled epitaxial $Ge_x Si_{(1-x)}$ growth during chamber pump down.

Low-temperature silicon epitaxial growth using a process gas mixture of $SiH_2Cl_2$, $H_2$, Ar and $AsH_3$ is the next group of steps in the sequence of FIG. 2. This sub-process includes the low-temperature epitaxial silicon growth step T17. This process uses Switch S1-wafer heating source and Switch S2-ECR microwave plasma source for low-temperature process activation. Following completion of silicon epitaxial growth step T17, vacuum pump down occurs T18 at which time Switch S2 is de-energized, but Switch S1 remains energized. This is because thermal energy by itself cannot drive epitaxial silicon process at low (e.g. $T \leq 500°C$.) temperatures.

Next, gate oxidation occurs using combined oxygen and argon gases. The oxidation step T20 uses three process energy sources, based on the activation of Switch S1-wafer heating source which is already energized, Switch S2-ECR microwave plasma source, and. Switch S3-deep ultraviolet incoherent photon source. These switches provide process activation energy until vacuum pump down T21 occurs. At vacuum pump down T21, Switch S2 and Switch S3 are de-energized, however, Switch S1 still remains energized to minimize thermal cycling.

Polysilicon deposition T23 takes place next using a composition of $SiH_4$, $H_2$ and Ar gases. Polysilicon deposition step T23 activated switches include Switch S1 for wafer heating source and Switch S5 for RF magnetron plasma source. Following polysilicon deposition T23, vacuum pump down T24 occurs, to prepare the process chamber for the final fabrication step. All process energy sources are off during the vacuum pump down step T24.

In the multi-step fabrication process of the present example, the final sub-process is polysilicon doping. During polysilicon doping, a combination of $AsH_3$ and $H_2$ gases are used to dope the silicon layer resulting from the prior polysilicon deposition step. For this purpose, Switch S4 is activated in order to operate the deep ultraviolet excimer laser source as the process energy source. Doping step T26 achieves the desired doping level by gas-immersion laser doping and a final vacuum pump down T27 then occurs. This completes the multi-step in-situ semiconductor device fabrication process according to the example of FIG. 2 using the apparatus and method of the present invention. The multi-step process of FIG. 2 can also use alternative and different combinations of the multiple process energy sources used in this example.

Although FIG. 2 illustrates a simplified example, virtually unlimited variations of the concept of using multiple process energy sources and activation switches for multi-step in-situ semiconductor device fabrication are possible and should be considered within the scope of the present invention. For example, although the example of FIG. 2 shows a degree of thermal cycling in energizing and deenergizing Switch S1, because the wafer temperature level that activated Switch S1 creates is less than that necessary for epitaxial silicon process activation using thermal Switch S1 alone, less thermal cycling than in conventional techniques can be achieved. Alternatively, because Switch S1 can be operated at less than the level necessary for epitaxial silicon growth process activation, Switch S1 could be left energized throughout several stages of the multi-step fabrication process. This would eliminate virtually most thermal cycling during an in-situ multi-step fabrication process.

Note that in the transition between individual sub-processes, vacuum pump down cycles clear process chamber of gases from the immediately previous cycle. These transition times result in some delay from one process step to the next step. However, reduced thermal cycling offered by the multi-switch processing methodology of this invention can compensate for the pump-down transition delay times. Moreover, the time division plasma chopping of this invention can significantly reduce the number of gas switching or process ambient transition cycles.

The multi-switch processing method illustrated by the example of FIG. 2 shows the use of five independently controlled process activation Switches S1 through S5. Using these five independent process activation switches, multiple steps can be performed in a device fabrication process with minimal temperature cycling, and increased throughput relative to conventional wafer processing methods. Although five process energy sources are used in this example, the same process sequence can be performed with fewer process activation sources.

Figure 3:
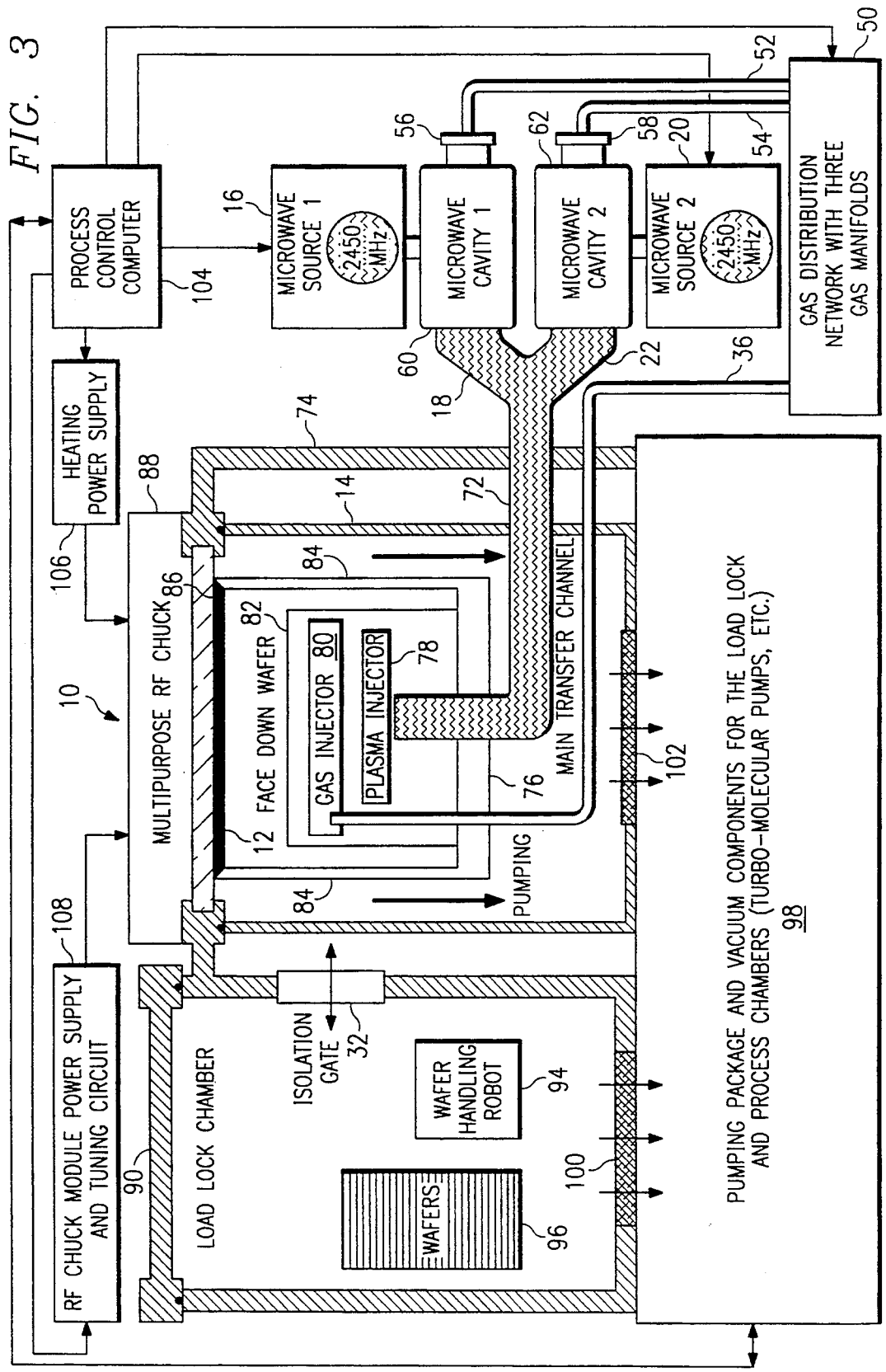
FIG. 3 shows a partially-broken-away diagrammatic view of a multi-channel plasma processing system with the remote microwave plasma channels employing a preferred embodiment of the multi-channel time-division plasma chopping apparatus of the present invention.

A related and important aspect of this invention relates to a time-division plasma chopping methodology and device for in-situ multi-step processing with reduced process ambient cycling and gas flow cycling effects. FIG. 3 illustrates an application of a preferred embodiment of the multi-channel time-division plasma chopping apparatus of the present invention within a single-wafer plasma processing reactor. As will be described in detail, FIG. 3 shows the use of three independent plasma process activation sources. It may be beneficial, however, to appreciate a typical wafer processing environment for their use.

Beginning at the bottom right corner of FIG. 3, the semiconductor wafer processing system 10 includes gas distribution network 50. From gas distribution network 50 come microwave plasma gas inlet-1 52 and microwave plasma gas inlet-2 54. Microwave plasma gas inlets 52 and 54 connect via gas discharge tube connections 56 and 58 to microwave discharge tubes 18 and 22 respectively. Microwave discharge cavities 60 and 62 can generate gas discharge and send remotely generated plasma streams into discharge tubes 18 and 22. Discharge tubes 18 and 22 merge into a main gas transfer channel 72. Main transfer channel 72 penetrates reactor casing 74 and process chamber 14 to lead through support plate 76. Main transfer channel 72 connects to plasma injector 78 within quartz or metallic cylinder 82. Also, leading from gas distribution network 50, input gas channel 36 penetrates through reactor casing 74, into process chamber 14, through support plate 76, and into gas injector 80 surrounded by quartz or metallic cylinder 82. The single-wafer plasma processing reactor of FIG. 3 employs two remote microwave plasma process energy sources besides an RF source on the process chamber. If necessary, the number of parallel microwave plasma channels can be increased beyond two. For plasma generation, microwave source 16 and microwave source 20 connect to microwave discharge cavities 60 and 62, respectively. Above quartz or metallic cylinder 82, sits semiconductor wafer 12 clamped against the RF chuck surface (with wafer heating and/or cooling capability) and supported by holding pins 84 which attach to support plate 76. Load lock chamber 90, within plasma processing system 10, includes isolation gate 32 that comprises a passage for wafer handling robot 94 to transfer semiconductor wafers between the fabrication position on pins 84 in process chamber 14 and wafer cassette 96. To maintain vacuum in both process chamber 14 and load lock chamber 90, pumping package 98 connects via vacuum apertures 100 and 102.

Through RF chuck surface 86, multi-purpose chuck 88 provides RF process activation energy for plasma processing of semiconductor wafer 12 clamped against the chuck. Process control computer 104 controls operation of heating (or cooling) power supply 106 and chuck module RF power supply and tuning circuit 108 to control application of RF electromagnetic energy to multipurpose chuck 88. Process control computer 104 also controls process plasma generation by controlling the operation of microwave sources 16 and 20 (microwave switch control).

Although the configuration of FIG. 3 has fewer process activation switches than the conceptual illustration of FIG. 1, it illustrates the use of two parallel remote plasma process energy sources in connection with a multipurpose RF chuck for semiconductor device fabrication. The configuration of FIG. 3 may, alternatively, include deep ultraviolet photochemical process energy sources instead of microwave plasma sources for process activation, or alternatively may include a thermal heating source such as the lamp heating module of Switch S1 in FIG. 2. The essence of FIG. 3, however, is that multiple independent process activation sources can be used to significantly improve equipment performance and processing throughput within the conventional design of a semiconductor wafer plasma processing system 10.

Figure 4:
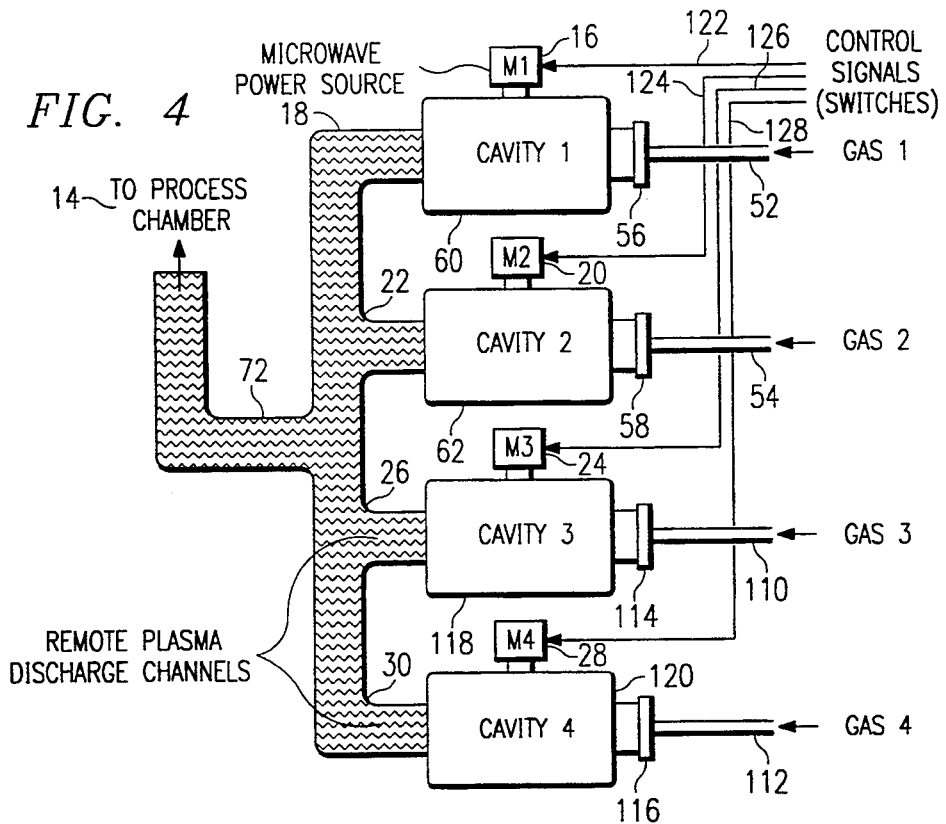
FIG. 4 illustrates one embodiment of the multi-channel gas discharge module, of the present invention comprising a plurality of (four) stacked, independent remote plasma process energy sources and their associated microwave plasma gas discharge activating switches according to the present invention.
Figure 5:
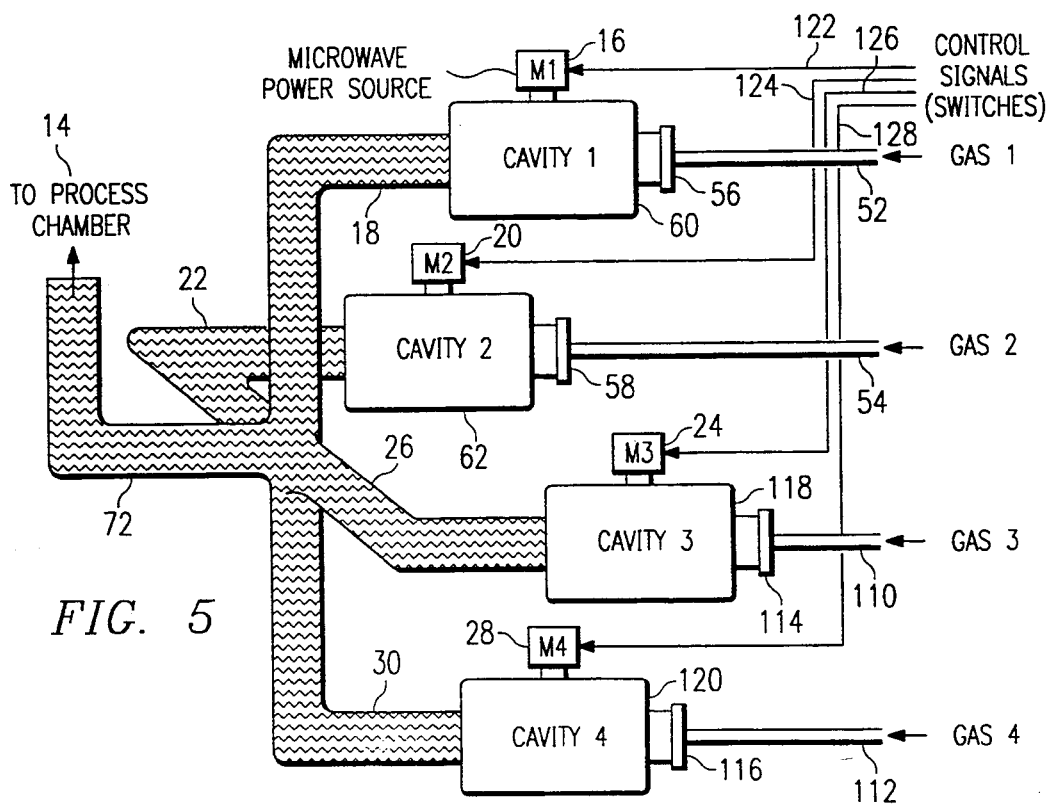
FIG. 5 shows an alternative embodiment of the multi-channel gas discharge module of the present invention incorporating multiple (four) radially-distributed (or cylindrically-distributed) microwave plasma process energy sources and their associated process activation switches.

FIGS. 4 and 5 show alternative implementations of the parallel remote plasma generation sources of FIG. 3 when more remote plasma channels are required. In FIG. 4, gases 1, 2, 3, and 4 enter plasma gas inlets 52, 54,110 and 112, respectively. These lead to respective cavity discharge tube connections 56, 58, 114 and 116 which pass through microwave cavities 1 through 4, 60, 62,118 and 120. Associated with each microwave cavity 1 through 4 are magnetron microwave power sources M1 through M4 (16, 20, 24, and 28, respectively). Control signals 122, 124,126, and 128, respectively, come from a process control computer to control these magnetron sources. These control signals act as process activation switches. Respective outlets from microwave cavities 1 through 4, (18, 22, 26 and 30, respectively) merge at main transfer channel 72 which permits continuous process gas flow to process chamber 14. FIG. 5 shows, instead of the stacked configuration of FIG. 4, a radial or cylindrical configuration in which remote plasma tubes 18, 22, 26, and 30 radially connect to main transfer channel 72. Other configurations are also possible.

These multi-channel plasma devices are essential components of the time-division plasma chopping of this invention. The parallel remote plasma channels may employ RF induction discharge energy sources instead of microwave cavities.

An example of using the independent remote plasma generation sources, would be where gas 1 is nitrogen flowing through microwave cavity 1 60, gas 2 would be nitrous oxide or oxygen flowing through microwave cavity 2 62, gas 3 at cavity 3 would be argon, and gas 4 through cavity 4 would be silane or dichlorasilane gas.

By controlling, not the gas flow as in time-division gas flow chopping, but control signals 122, 124, 126 and 128, continuous gas flows from the plasma chopping device of the present invention are possible (all gases flowing), while each gas can be selectively activated according to a timing sequence to drive a desired and specific deposition process associated with the activated plasma channel or channels.

The inactivated gas channels allow continuous molecular gas flows and will have little or negligible effect on the overall process. This eliminates excessive gas flow cycling and process ambient stabilization transients and associated particulate contamination problem of repeated gas cycling. Thus, to generate a plasma, magnetron microwave source M1 can be operated variably among several states or between two "ON" and "OFF" states that generate plasma from gas 1 within discharge cavity 1. The only activated plasma entering the process chamber, then, will be that from microwave discharge cavity 1. Depending on the application, one or more microwave channels are activated during any process step to drive a desired process at any time.

Figure 6:
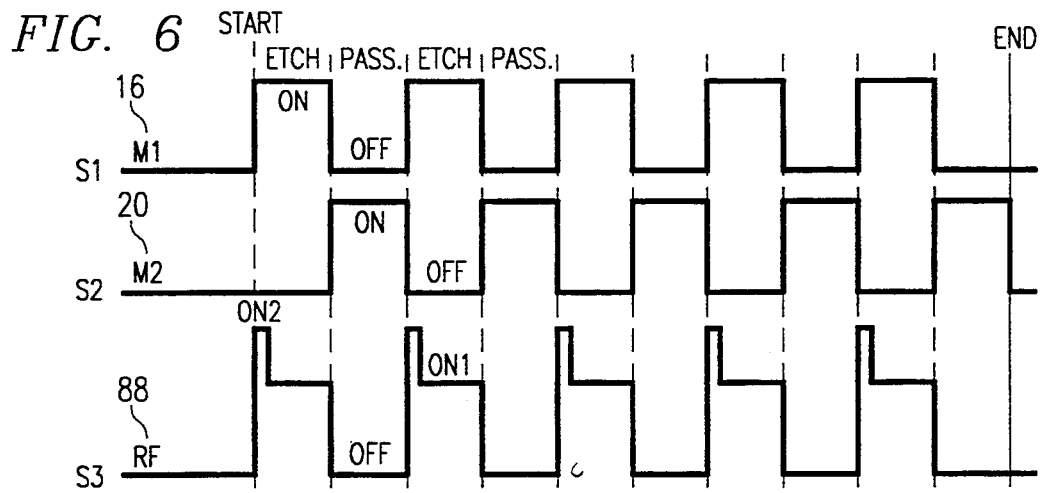
FIG. 6 illustrates the time sequence or pulse diagram of process activation switch control signals of multiple, independent plasma process energy sources (two remote microwave and one RF plasma) according to one embodiment of the present invention to perform a plasma-assisted semiconductor wafer anisotropic etching process.

FIG. 6 shows use of the time-division plasma chopping technique of the present invention with two remote microwave gas discharge and one RF plasma channel to achieve the multi-step sequential etching-passivation layer deposition and perform a net anisotropic tungsten etch process. According to FIG. 6, activation Switch S1 intermittently controls magnetron source M1. A process etch gas such as $SF_6$ flows continuously through this plasma channel. Activation Switch S2 controls magnetron microwave switch M2 and activation Switch S3 is a multi-purpose RF chuck in a process chamber (additional RF plasma activation). The process of FIG. 6 entails injecting two process gases continuously through remote microwave (or RF induction) discharge tubes associated with process activation switches M1 and M2. Plasma discharge can also occur or be substantially enhanced by direct interaction of the remote process and plasma gases with an RF chuck within the main process chamber. The microwave plasma activation Switches S1 and S2, and RF chuck activation Switch S3 and any substrate heating or cooling energy source can be switched on and off.

In etching processes with combined radio-frequency and remote microwave process plasma activation the hybrid plasma etch rate from both the RF and microwave discharges is usually much higher than the individual etch rates with only microwave plasma energy source or radio-frequency discharge and even much greater than the sum of the individual etch rates obtained with any of the two energy sources. Therefore, the radio-frequency plasma channel and the two remote microwave plasma channels can be switched and cycled in time such that a high rate of anisotropic etching proceeds in the sequence described by FIG. 6 with negligible lateral etch or undercut. Note that according to the present invention, all gases can flow continuously and the time-division plasma chopping technique provides the same fabrication process improvements of gas flow chopping without flow surges and related contamination of the semiconductor wafer and processing throughput degradations.

As an example of the application of the present invention shown in FIG. 6, suppose that Gas 1 is sulphur hexafluoride ($SF_6$) for tungsten etch and Gas 2 is ammonia ($NH_3$) used for tungsten nitride passivation layer formation. Sequential etching and passivation layer deposition occurs in this multicycle process. In FIG. 6, starting the process begins with an etching step. During the first etch step, the process activation Switches S1 (for SF$_6$ microwave discharge) and S3 (for RF plasma enhancement) are turned on while the Switch S2 (related to NH$_3$ gas) remains off. As a result, a mixed RF and microwave (M$_1$) plasma discharge and process enhancements act on the etch gas (SF$_6$) and result in a net tungsten etch.

Note that since SF$_6$ discharge switch S2 is off, NH$_3$ gas is not activated by the microwave source and molecular NH$_3$ gas enters the process ambient without any remote gas discharge in that microwave discharge channel. The RF activation effect is rather weak or negligible on the NH$_3$ gas in the process chamber since the on-state level of RF power is selected to be fairly low. As a result, NH$_3$ has weak or negligible interactions with the excited etch species and also it does not result in any appreciable passivation layer formation during that etch cycle. On the other hand, the enhancement effects of the RF energy source on SF$_6$ plasma species are quite strong because a remote SF$_6$ discharge has already been formed by activating the first microwave discharge channel. It can be concluded that the RF process energy source has significant enhancement effects on the remote microwave plasma species while its effects on molecular process gases without any remote excitation is rather weak or negligible.

It can be seen that in this example, the RF energy source has two "ON" states. During the first step, the radio-frequency channel is turned on and for a short period of time the RF power level is kept at a higher than normal level (higher "on" state) in order to remove any passivation or contamination layer from the flat horizontal surfaces by directional energetic ions without removing it from the side walls. Then, the etch proceeds with minimal surface and gas-phase nucleation effects of the ammonia molecules. During the following side-wall passivation cycle, NH$_3$ remote plasma forms a tungsten WN$_x$ passivant layer on the semiconductor wafer (on horizontal as well as sidewall surfaces). For this step, microwave channel M2 is turned on, and both microwave channel M1 and RF channel are turned off. This configuration produces a thin tungsten nitride passivant layer by an isotropic reaction on the semiconductor wafer surface without generating any appreciable amount of fluorine-activated etch species, even though both SF$_6$ and NH$_3$ are continually flowing into the main process chamber. The subsequent etch and passivation steps follow the first two steps in a periodic manner until the tungsten layer etch is completed. The number of etch/passivation cycles employed in a given etch process can vary depending on the specific etch process requirements. A typical single-wafer etch process may employ 3–100 etch passivation cycles. Although the example in FIG. 6 shows the application of time-division plasma chopping of this invention to anisotropic tungsten etch using SF$_6$/HN$_3$ gas flows in the multi-channel plasma processing reactor, this invention is applicable to a wide range of other etch and deposition applications based on different process chemistries. For instance, this invention can be used for high throughput etching of stacked multilayer structures where each layer requires a different activated etch species (e.g. polycide gates). This can be done by selective time-division plasma chopping techniques of this invention while all or some process gases are continuously flowing.

Figure 7:
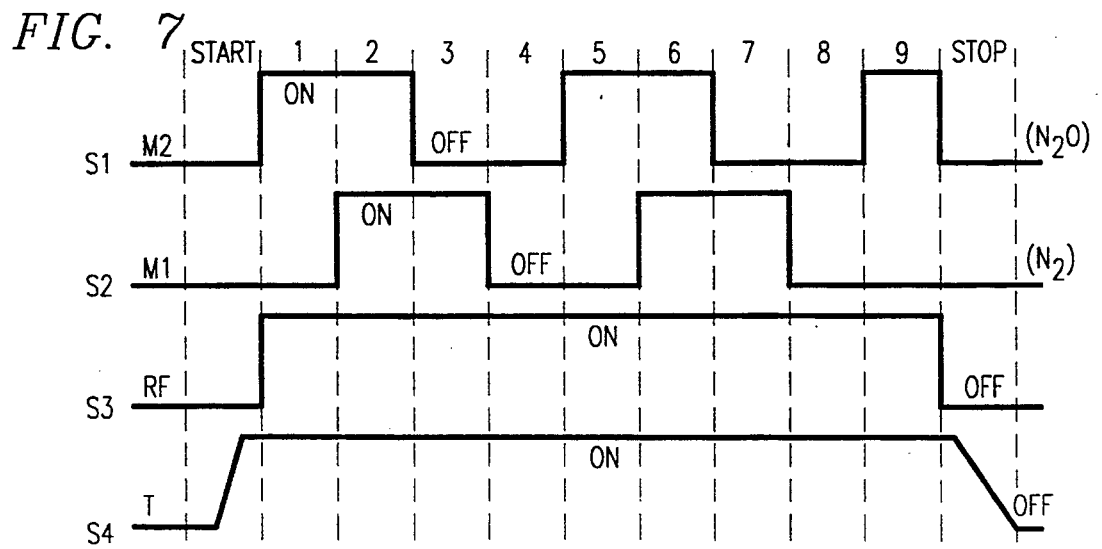
FIG. 7 shows the time sequence or pulse diagram of process activation switch control signals of multiple, independent plasma process energy sources for a multi-channel time-division plasma chopping process according to the present invention for a plasma-assisted semiconductor wafer in-situ multi-layer deposition process.

FIG. 7 shows yet another application of the time-division plasma chopping techniques of the present invention for multilayer dielectric and semiconductor deposition. FIG. 7 shows, for example, the use of two remote process activation switches associated with two parallel microwave gas discharge plasma channels. In conjunction with the thermal activation Switch S4 and an RF plasma activation, Switch S3, the application of FIG. 1 uses two separate remote microwave plasma energy source chopping channels (S1 and S2). The process in FIG. 1 yields a dielectric and amorphous silicon superlattice heterostructure. This in-situ multi-step process can be performed in the multi-channel plasma processing reactor of FIG. 3.

Suppose that Gas 1 is N$_2$O. Gas 2 is N$_2$, both passing through remote microwave plasma channels M1 and M2. A third process gas introduced directly into the main process chamber may be a silicon source gas such as silane (SiH$_4$), or dichlorosilane (SiH$_2$Cl$_2$). The process of FIG. 7 starts with all process activation switches (S1–S4) de-energized and continuously flowing all process gases into the process chamber. This will stabilize the overall process environment with all the process energy sources in the "OFF" state.

For the first layer, energizing activation Switch S1 results in selective N$_2$O gas discharged and deposition of silicon dioxide (SiO$_2$) layer. During deposition of the first layer, activation Switch S1 provides microwave plasma activation of N$_2$O by turning M1 from an off-state to an on-state. The RF plasma activation Switch S3 is also activated and remains on during all deposition steps. The first and subsequent deposition steps all employ some thermal process activation by turning on Switch S4. However, Switch S4 or thermal activation by itself cannot result in any layer deposition unless some remote plasma activation is present. During the remainder of the steps of creating the nine-layer dielectric superlattice heterostructure of the FIG. 7 example, process energy sources S3 and S4 remain energized.

Once the process reaches the desired thickness of oxide layer, a second layer of Si$_x$O$_y$N$_Z$ is applied. To deposit the second layer, the thermal activation Switch S4, RF plasma S3, and microwave plasma channels M1 and M2 for process gases N$_2$ and N$_2$O are all energized. In the following a layer of Si$_3$N$_4$ is deposited by de-energizing microwave activation Switch S1. Layer four is a thin amorphous silicon layer that is deposited by additionally turning off microwave activation Switch S2 (with only RF plasma and thermal process activation). Layer five of SiO$_2$ is applied by energizing N$_2$) plasma activation Switch S1. Both RF and thermal process energy sources (S3, S4) remain activated. Next, a sixth layer (Si$_x$O$_y$N$_z$) is applied by activating all process energy sources.

A seventh layer Si$_3$N$_4$ is deposited by deenergizing microwave plasma activation Switch S1 and leaving energized all other process activation sources (S2, S3, S4 on). To generate eighth thin layer of material (amorphous silicon), only the thermal and RF process energy sources are energized and S3 and S4 remain on.

Finally, by energizing microwave plasma activation Switch S1, the process that FIG. 7 describes produces an SiO$_2$ layer. Stopping the process involves deenergizing thermal activation Switch S4, remote plasma activation Switches S1 and S2, and turning off RF plasma process activation Switch S4. FIG. 7, therefore, describes an in-situ multi-step fabrication process that produces a nine-layer dielectric and silicon superlattice heterostructure without the gas cycling of gas chopping method by selectively energizing and using several process energy sources according to a pre-specified time sequence.

It should be realized that the examples of FIGS. 6 and 7 are only two of a virtually unlimited number of applications of the multi-switch processing and time-division plasma chopping techniques embodied within the scope of the present invention. Furthermore, although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description it is therefore contemplated that the appended claims will cover such modifications that fall within the true scope of the invention.

What is claimed is:

1. A method for multi-channel time-division plasma chopping in association with a plasma processing reactor, comprising the steps of:
    independently and selectively generating a plurality of process plasmas and activated species using a plurality of independent process energy/excitation sources, said process energy/excitation sources operable to generate energy at more than two discrete levels;
    independently directing to a main transfer channel mixtures of process gases and said generated process plasmas and activated species through a plurality of discharge channels associated with said process energy/excitation sources; and
    transferring said mixtures from said main transfer channel to said reactor process chamber where wafer is placed.

2. The method of claim 1, further comprising the step of independently and selectively controlling the "on" and "off" states of said excitation sources via their associated process activation switches.

3. The method of claim 1, further including the step of exciting said gas and plasma mixture within the plasma processing reactor using a radio-frequency process energy source.

4. The method of claim 1, wherein said mixture directing step further including the step of continuously flowing gases through said gas discharge and activating channels to said main transfer channel.

5. The method of claim 1, further including the step of sequentially and selectively operating a plurality of process activation switch controls to perform a sequential multi-step in-situ semiconductor device fabrication process.

6. The method of claim 1, wherein said process activation step further includes the step of generating said activated process gas using a photochemical source.

7. The method of claim 1, wherein said process activation step further includes the step of generating said process activation using a deep ultraviolet source.

8. The method of claim 1 wherein said process energy/excitation sources generate energy at three discrete levels.

9. The method of claim 1 wherein said process energy/excitation sources generate energy at a continuum of energy levels.

10. A method for multi-channel time-division plasma chopping in association with a plasma processing reactor, comprising the steps of:
    independently and selectively generating a plurality of process plasmas and activated species using a plurality of independent process energy/excitation sources;
    exciting said gas and plasma mixture within the plasma processing reactor using a radio-frequency process energy source;
    independently directing to a main transfer channel mixtures of process gases and said generated process plasmas and activated species through a plurality of discharge channels associated with said process energy/excitation sources; and
    transferring said mixtures from said main transfer channel to said reactor process chamber where wafer is placed.

11. A method for multi-channel time-division plasma chopping in association with a plasma processing reactor, comprising the steps of:
    independently and selectively generating a plurality of process plasmas and activated species using a plurality of independent process energy/excitation sources, at least one of said sources being a photochemical source;
    independently directing to a main transfer channel mixtures of process gases and said generated process plasmas and activated species through a plurality of discharge channels associated with said process energy/excitation sources; and
    transferring said mixtures from said main transfer channel to said reactor process chamber where wafer is placed.

12. A method for multi-channel time-division plasma chopping in association with a plasma processing reactor, comprising the steps of:
    independently and selectively generating a plurality of process plasmas and activated species using a plurality of independent process energy/excitation sources, at least one of said sources being a deep ultraviolet source;
    independently directing to a main transfer channel mixtures of process gases and said generated process plasmas and activated species through a plurality of discharge channels associated with said process energy/excitation sources; and
    transferring said mixtures from said main transfer channel to said reactor process chamber where wafer is placed.

* * * * *